United States Patent
Shen et al.

(10) Patent No.: US 10,943,975 B2
(45) Date of Patent: Mar. 9, 2021

(54) METHOD OF MANUFACTURING A SEMICONDUCTOR DEVICE HAVING SIDE-DIFFUSED TRENCH PLUG

(71) Applicant: Littelfuse, Inc., Chicago, IL (US)

(72) Inventors: Ader Shen, Hsin-Chu County (TW); Ting-Fung Chang, Hsin-Chu County (TW); James Lu, Hsin-Chu County (TW); Wayne Lin, Hsin-Chu County (TW)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/457,500

(22) Filed: Jun. 28, 2019

(65) Prior Publication Data

US 2019/0326390 A1 Oct. 24, 2019

Related U.S. Application Data

(63) Continuation of application No. 15/190,469, filed on Jun. 23, 2016, now abandoned.

(51) Int. Cl.
*H01L 21/74* (2006.01)
*H01L 29/06* (2006.01)
(Continued)

(52) U.S. Cl.
CPC .... *H01L 29/0642* (2013.01); *H01L 21/30604* (2013.01); *H01L 21/324* (2013.01);
(Continued)

(58) Field of Classification Search
CPC ... H01L 29/861; H01L 29/866; H01L 29/868; H01L 29/0642; H01L 21/22;
(Continued)

(56) References Cited

U.S. PATENT DOCUMENTS 5,539,238 A 7/1996 Malhi
6,373,100 B1 * 4/2002 Pages ............... H01L 29/7809
257/329
(Continued)

FOREIGN PATENT DOCUMENTS

EP 2009686 A1 12/2008
GB 2137019 A 9/1984
(Continued)

OTHER PUBLICATIONS

Extended European Search Report dated Feb. 3, 2020 for European Patent Application No. 17815900.0.

*Primary Examiner* — Khiem D Nguyen
(74) *Attorney, Agent, or Firm* — Kacvinsky Daisak Bluni PLLC

(57) ABSTRACT

A semiconductor device structure may include a substrate having a substrate base comprising a first dopant type; a semiconductor layer disposed on a surface of the substrate base, the semiconductor layer comprising a second dopant type and having an upper surface; and a semiconductor plug assembly comprising a semiconductor plug disposed within the semiconductor layer, the semiconductor plug extending from an upper surface of the semiconductor layer and having a depth at least equal to a thickness of the semiconductor layer, the semiconductor plug having a first boundary, the first boundary formed within the semiconductor layer, and having a second boundary, the second boundary formed within the semiconductor layer and disposed opposite the first boundary, wherein the first boundary and second boundary extend perpendicularly to the surface of the substrate base.

17 Claims, 4 Drawing Sheets

(51) Int. Cl.
  *H01L 21/76* (2006.01)
  *H01L 21/306* (2006.01)
  *H01L 21/3205* (2006.01)
  *H01L 21/324* (2006.01)
  *H01L 21/763* (2006.01)
  *H01L 21/768* (2006.01)
  *H01L 23/535* (2006.01)
  *H01L 29/861* (2006.01)

(52) U.S. Cl.
  CPC ...... *H01L 21/32055* (2013.01); *H01L 21/743* (2013.01); *H01L 21/76* (2013.01); *H01L 21/763* (2013.01); *H01L 21/76877* (2013.01); *H01L 23/535* (2013.01); *H01L 29/8611* (2013.01)

(58) Field of Classification Search
  CPC ............. H01L 21/76256; H01L 21/743; H01L 21/761; H01L 21/76; H01L 21/324; H01L 21/76877; H01L 21/2254; H01L 21/2251; H01L 21/76898; H01L 21/763
  See application file for complete search history.

(56) References Cited

U.S. PATENT DOCUMENTS

| | | | | |
|---|---|---|---|---|
| 6,608,350 | B2* | 8/2003 | Kinzer | H01L 29/0634 257/341 |
| 6,846,744 | B1* | 1/2005 | Chen | H01L 27/1087 257/E21.233 |
| 8,106,436 | B2* | 1/2012 | Grivna | H01L 21/76232 257/301 |
| 2004/0018718 | A1* | 1/2004 | Chen | H01L 21/76867 438/627 |
| 2004/0171220 | A1* | 9/2004 | Yang | H01L 21/763 438/270 |
| 2009/0096021 | A1* | 4/2009 | Loechelt | H01L 21/761 257/341 |
| 2011/0073938 | A1* | 3/2011 | Takahashi | H01L 29/7811 257/328 |
| 2011/0241185 | A1* | 10/2011 | Koester | H01L 23/552 257/659 |
| 2012/0319761 | A1* | 12/2012 | Zundel | H01L 29/8611 327/530 |
| 2013/0341689 | A1* | 12/2013 | Chen | H01L 29/78 257/288 |
| 2014/0308788 | A1* | 10/2014 | Lin | H01L 29/105 438/268 |
| 2015/0061007 | A1* | 3/2015 | Yang | H01L 29/0634 257/337 |

FOREIGN PATENT DOCUMENTS

JP  2009-170600 A  7/2009
KR  100952538 B1  4/2010

* cited by examiner

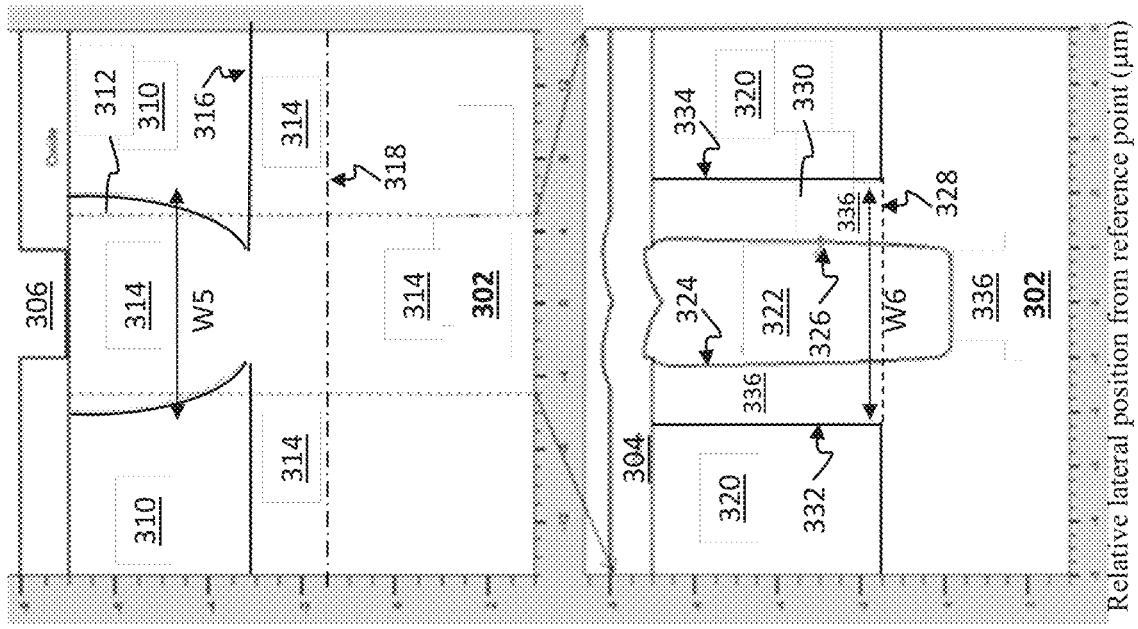
FIG. 3B
FIG. 3C
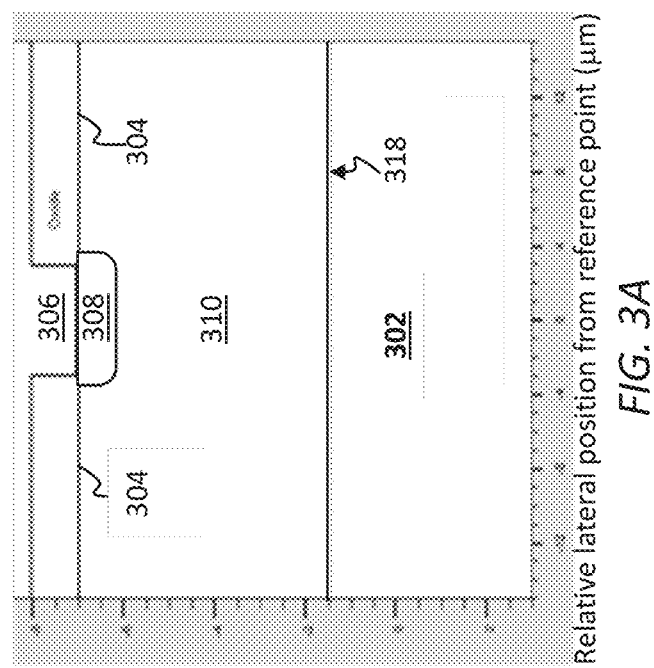
FIG. 3A

METHOD OF MANUFACTURING A SEMICONDUCTOR DEVICE HAVING SIDE-DIFFUSED TRENCH PLUG

CROSS-REFERENCE TO RELATED APPLICATIONS

This application is a continuation of U.S. Non-Provisional patent application Ser. No. 15/190,469, filed Jun. 23, 2016, abandoned, which application is incorporated by reference herein in its entirety.

BACKGROUND

Field

Embodiments relate to the field of semiconductor devices, and more particularly to semiconductor devices having semiconductor plug structures.

Discussion of Related Art

In semiconductor technology, devices may be fabricated in a substrate that includes a substrate base of a first dopant type and a layer formed over the substrate base of a second dopant type. This structure affords a convenient template to fabricate a variety of devices, including transistors, Zener diodes, PN diodes, and other known devices. In a given semiconductor substrate, different devices may be fabricated in the substrate and may be laterally spaced from one another. In known semiconductor devices, semiconductor plugs may be formed from the surface of a substrate in order to provide junction isolation between different devices, or alternatively to provide low resistance structures extending into the semiconductor layer.

In known processing, semiconductor plugs may be formed by forming an opening within an oxide or other insulator layer disposed on top of the semiconductor layer, and by subsequently introducing a dopant species into the semiconductor layer through the opening. This process is followed by a thermal treatment (annealing) involving high temperature heating of the substrate for a duration sufficient to drive the dopant species to a target depth for forming the device structure to be fabricated, such as a junction isolation plug structure. A drawback of these known processing approaches for forming semiconductor plug structures is the relatively high thermal budget entailed for forming semiconductor plug structures. A further drawback is the relatively large lateral width of the semiconductor plug structures resulting from lateral diffusion during the thermal treatment and also from the relatively thick silicon layers that may be employed. As an example, for 40 V technology, in a known approach an N-type epitaxial silicon layer may be grown as the semiconductor layer on a substrate base, where the thickness of the epitaxial silicon layer is 7 µm. To form a junction isolation structure in the N-type epitaxial silicon layer a semiconductor plug structure of a P-type dopant may be formed. To form the semiconductor plug structure to the appropriate depth to generate acceptable isolation properties, a resulting lateral width of the semiconductor plug structure may be approximately 14 µm. Similarly, to form a low resistance N-type plug structure in a similar N-type semiconductor layer, a resulting lateral width of the semiconductor plug structure may be approximately 20 µm. These lateral dimensions, in turn, restrict the ability to space devices closer together.

It is with respect to these and other issues that the present improvements are provided.

SUMMARY

Exemplary embodiments are directed improved semiconductor plug structures. In one embodiment, a semiconductor device structure is provided. The semiconductor device may include a substrate having a substrate base comprising a first dopant type and having a substrate base surface; a semiconductor layer disposed on the substrate base surface, the semiconductor layer comprising a second dopant type and having an upper surface; and a semiconductor plug assembly comprising a semiconductor plug disposed within the semiconductor layer, the semiconductor plug extending from the upper surface of the semiconductor layer and having a depth at least equal to a thickness of the semiconductor layer, the semiconductor plug having a first boundary and a second boundary disposed opposite the first boundary, the first boundary and the second boundary being formed within the semiconductor layer, wherein the first boundary and second boundary extend perpendicularly to the substrate base surface.

In another embodiment, a method of forming a semiconductor plug in a substrate may include providing a semiconductor layer on a substrate base surface of a substrate base, the substrate base comprising a first dopant type, and the semiconductor layer comprising a second dopant type; etching a trench into the semiconductor layer, wherein the trench has a first trench sidewall and a second trench sidewall, the first trench sidewall and second trench sidewall defining a first interface and a second interface, respectively, with the semiconductor layer; forming a dopant layer along the first trench sidewall and second trench sidewall; and annealing the substrate, wherein a diffused region is formed, the diffused region having a first boundary and a second boundary, the first boundary and second boundary extending within the semiconductor layer from the first trench sidewall and the second trench sidewall, wherein the first boundary and the second boundary define a boundary between the semiconductor plug and the semiconductor layer.

BRIEF DESCRIPTION OF THE DRAWINGS

FIGS. 3A to 3C provide simulations of formation of semiconductor plug structures, illustrating advantages of the present embodiments;

DESCRIPTION OF EMBODIMENTS

Figure 1A:
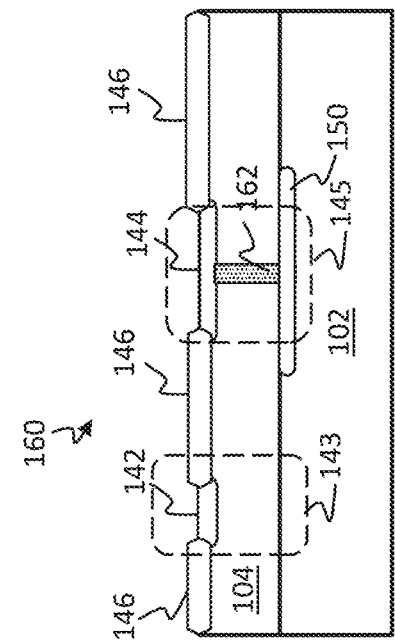
FIG. 1A shows a substrate according to embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and over, may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments are generally related to semiconductor devices formed in a semiconductor substrate such as silicon. Various embodiments provide improvements in device architecture, performance and processing, in particular for semiconductor devices based upon a semiconductor layer formed on a semiconductor substrate base. As used herein the term "semiconductor device" may refer to a single device such as a semiconductor diode, or may alternatively refer to a group of devices, including different devices, where the group of devices may be located within the same substrate, such as a silicon wafer. A semiconductor device may refer to a collection of devices arranged in an electrical circuit for example. A semiconductor device may refer also to passive devices including semiconductor plugs formed as junction isolation structures, or conductive plugs. Additionally, the term "semiconductor device structure" may refer to a semiconductor device or group of semiconductor devices as arranged, for example, within a substrate or within part of a substrate.

In the embodiments disclosed herein, a "substrate" generally refers to a semiconductor substrate, such as a silicon wafer, unless otherwise noted. The term "substrate" may include a substrate base formed of monocrystalline silicon, and may include other components such as a semiconductor layer disposed on a substrate base, oxides, other insulator regions, doped regions, metallic contact regions, polycrystalline features, and so forth. The term "substrate" may also refer to just a substrate base portion of a substrate, where other features may be disposed upon the substrate base.

Referring now to FIG. 1A, there is shown a substrate 100 according to embodiments of the disclosure. The substrate 100 includes a substrate base 102, such as monocrystalline silicon. The substrate base 102 may be doped with a first dopant type, such as N-type doping or P-type doping. According to various embodiments the doping level of the first dopant type may range from $1E17/cm^3$ to $1E20/cm^3$. The embodiments are not limited in this context.

The substrate 100 further may include a semiconductor layer 104 disposed upon the substrate base 102. As shown, the semiconductor layer 104 extends between an upper surface 109 of the semiconductor layer 104 to an interface 120 between the substrate base 102 and semiconductor layer 104. In various embodiments the semiconductor layer 104 may have a layer thickness as shown by h2 of several µm to tens of µm, such as 5 µm to 10 µm in some examples. The semiconductor layer 104 may be formed according to known processes, such as epitaxial growth processes, where the semiconductor layer 104 is generally monocrystalline and having a crystalline structure aligned in registry with the underlying crystalline structure of the substrate base 102. As such, the semiconductor layer 104 may generally be composed of the same material as the substrate base 102, such as silicon, while also being populated with a dopant. According to various embodiments, the semiconductor layer 104 may be doped with a second dopant type, opposite the first dopant type for dopants used in the substrate base 102. For example, when the substrate base comprises a P-type dopant, the semiconductor layer may comprise an N-type dopant. According to various embodiments the doping level of the second dopant type in the semiconductor layer 104 may range from $1E12/cm^3$ to $1E17/cm^3$. The embodiments are not limited in this context. In this manner, the substrate base 102 and semiconductor layer 104 may serve as a template or platform in which to fabricate various types of devices including devices based upon P/N junctions ("PN junctions") such as diodes and transistors, Schottky devices, conductors, and so forth.

In various embodiments, the substrate 100 may include a semiconductor plug assembly composed of at least one semiconductor plug, shown as the semiconductor plug 106. In some embodiments, the semiconductor plug 106 may function as a junction isolation device or structure, while in other embodiments the semiconductor plug may function as a conductor for lowering series resistance, for example. As shown in FIG. 1A, the semiconductor plug 106 is disposed within the semiconductor layer 104, and extends from the upper surface 109 of the semiconductor layer 104 into the semiconductor layer 104. The semiconductor plug 106 has a depth, represented by h1, where the depth is at least equal to the layer thickness of the semiconductor layer 104, represented by h2. In the specific example of FIG. 1A, the semiconductor plug 106 extends into the substrate base 102, where h1>h2.

According to embodiments of the disclosure, the semiconductor plug 106 has a first boundary 110, where the first boundary 110 is formed within the semiconductor layer 104, and has a second boundary 112, where the second boundary 112 is also formed within the semiconductor layer 104, and is disposed opposite the first boundary 110. The first boundary 110 and second boundary 112 may form a general boundary between the semiconductor plug 106 and semiconductor layer 104 as shown. Notably, in the view shown in FIG. 1A, a cross-section of the substrate 100 is shown, where the cross-section lies parallel to the X-Z plane in the Cartesian coordinate system shown. In accordance with the present embodiments, the first boundary 110 and second boundary 112 may extend perpendicularly to the substrate base surface of the substrate base 102, where the substrate base surface is represented by the interface 120. More particularly, the interface 120 may lie parallel to the X-Y plane, while the first boundary 110 and second boundary 112 extend perpendicularly to the X-Y plane. As used herein the terms "perpendicular" or "extend perpendicularly" may refer to a relationship between a first feature such as the first boundary 110 and a second feature such as the interface 120, where an angle formed between the first feature is 80 degrees to 100 degrees. In examples, where the first boundary 110 and second boundary 112 extend at 90 degrees to the interface 120, the width W1 toward the upper part of the semiconductor plug 106 may be the same as the width W2 toward the lower part of the semiconductor plug 106. This feature of a uniform width of the semiconductor plug 106 provide numerous benefits as detailed below.

As further shown in FIG. 1A, the semiconductor plug 106 may include a trench 108 having a first trench sidewall 114 and a second trench sidewall 116, where the first trench sidewall 114 and second trench sidewall 116 define a first interface and a second interface, respectively, with the semiconductor layer 104. As discussed below, the trench 108 may be formed by exposing the substrate 100 to an etch process, such as a known anisotropic etch process to form a trench. For example, the ability of known etch processes, such as reactive ion etching (RIE) to form vertical trenches may be harnessed to etch the trench 108. This may result in the trench 108 having vertical sidewalls, meaning the first trench sidewall 114 and second trench sidewall 116 extend perpendicularly to the substrate base surface, as embodied by the interface 120. In so doing, the first trench sidewall 114 and second trench sidewall 116 of the trench 108 may provide vertical interfaces for diffusion of dopant species into the semiconductor layer 104 as detailed below. In brief, this geometry for diffusion of dopants facilitates the ability to form vertical boundaries of semiconductor plug 106, as embodied by the first boundary 110 and the second boundary 112. As further shown in FIG. 1A, the semiconductor plug 106 includes a diffused region 118, where the diffused region 118 extends within the semiconductor layer 104 from the first trench sidewall 114 and the second trench sidewall 116. In other words, the diffused region 118 is formed within the semiconductor layer 104 itself.

As further shown in FIG. 1A, the substrate 100 may include a surface feature 107, where the surface feature 107 is disposed on or near the upper surface 109. The surface feature 107 may be an insulator in some embodiments or may be a conductive material or semiconductor in other embodiments. The various features shown in the substrate 100, together with other features, may form various types of semiconductor device structures.

In particular, as discussed below, in different embodiments the semiconductor plug 106, together with substrate base 102, semiconductor layer 104, and other features may form different types of semiconductor device structures. In accordance with some embodiments of the disclosure, the semiconductor plug 106 may be formed of the first dopant type, meaning the same type of dopant as used to dope the substrate base 102. In these embodiments, the semiconductor plug 106 or similar semiconductor plug may be used as an isolation device to electrically isolate different regions of a substrate. For example, a semiconductor device structure may include multiple regions within a substrate where different devices are formed that are electrically to be isolated from one another. The semiconductor device structure according to these embodiments may include a first device formed in a first region, where the first device is at least partially disposed within the semiconductor layer 104. The semiconductor device structure may further include a second device formed in a second region, where the second device is at least partially disposed within the semiconductor layer 104, and where the first region is laterally displaced from the second region, meaning at a different position within the X-Y plane as shown in FIG. 1A. Examples of such devices include transistors, PN diodes, Zener diodes, TVS (transient voltage suppression) diodes, and Schottky diodes. The embodiments are not limited in this context. The semiconductor plug 106 in turn may be disposed between the first device and second device to electrically isolate the first device from the second device.

Figure 1C:
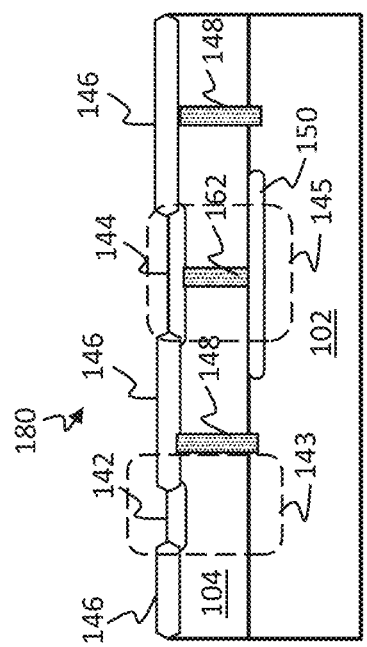
FIG. 1C illustrates another semiconductor device structure according to embodiments of the disclosure.
Figure 1B:
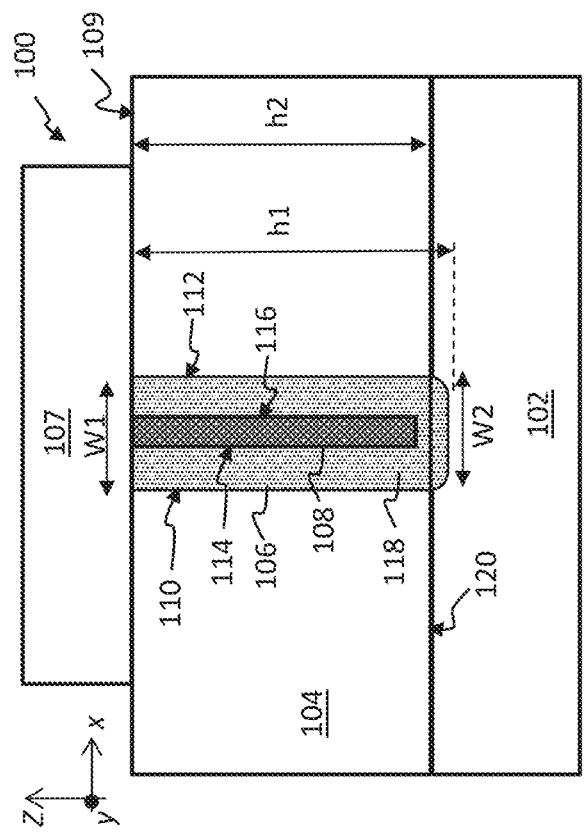
FIG. 1B illustrates a semiconductor device structure according to embodiments of the disclosure.

FIG. 1B illustrates a semiconductor device structure, shown as device structure 140 according to embodiments of the disclosure. The device structure 140 may be formed in a substrate as generally described above with respect to FIG. 1A. The device structure 140 may include, for example, the substrate base 102 and semiconductor layer 104. The device structure 140 in this embodiment is arranged having two semiconductor plugs for purposes of illustration, shown as the semiconductor plugs 148. In other embodiments, a device structure may include a first semiconductor plug and at least one additional semiconductor plug. In this embodiment, the semiconductor plugs 148 may be variants of the semiconductor plug 106 described above, and may have similar structure as described with respect to FIG. 1A. The semiconductor plugs 148 may be formed of a first dopant type where the substrate base 102 also has the first dopant type and the semiconductor layer 104 is formed having a dopant of the second dopant type. The device structure 140 may also include a surface insulator layer 146, where openings in the surface insulator layer 146 are created in order to generate features in the semiconductor layer 104. For purposes of illustration, in one example, the substrate base 102 may be P-type, having a carrier concentration of P-type active dopants of $1E19/cm^3$, while the semiconductor layer 104 is lightly doped N-type (NH having an active dopant concentration of N-type dopants of $1E14/cm^3$. Referring again also to FIG. 1A, because in the example of FIG. 1B the semiconductor plugs 148 comprise a first dopant type, in this case, P-type semiconductor, a PN junction forms at the first boundary 110 and second boundary 112. This PN junction may extend through the entire thickness of the semiconductor layer 104 as shown.

As further illustrated in FIG. 1B, the device structure 140 may include a structure 142 disposed in a first region 143 to the left of the left semiconductor plug, and may include a structure 144 formed in a second region 145 that is laterally displaced from the first region 143, between the left semiconductor plug and the right semiconductor plug. In one example, the structure 142 may be a heavily doped N-type region (N+), where the concentration of N-type dopants is $1E19/cm^3$, for example. Additionally, the structure 144 may be a heavily doped P-type region (P+), where the concentration of P-type dopants is $1E19/cm^3$, for example. Also shown in FIG. 1B is a buried region 150, where the buried region 150 may be a heavily doped N-type region (N+), where the concentration of N-type dopants is $1E19/cm^3$. The structure 142, together with semiconductor layer 104 (an N– region) and the substrate base 102 (P+ region) may form a first device disposed in the first region 143, in this case a first PIN diode. The structure 144, together with semiconductor layer 104 and the buried region 150 may form a second PIN diode in the second region 145, where the polarity of the second PIN diode is opposite of the first PIN diode formed in the first region 143. The second region 145 may also include a Zener diode, where the Zener diode is formed by virtue of the PN junction formed between the heavily doped P+ region, substrate base 102 and the heavily doped N+ region, buried region 150. The left member of the semiconductor plugs 148 may accordingly electrically isolate the first PIN diode formed in the first region 143 from the second PIN diode and Zener diode formed in the second region 145. Because the semiconductor plugs 148 may be formed from a trench 108, where the trench 108 in turn is formed by anisotropic etching into the semiconductor layer 104, the width of the semiconductor plugs 148 along the X-axis may be controlled independently of the height or depth of the semiconductor plugs 148 (see W2 and h1 in FIG. 1A). This independent control allows the width to be scaled to smaller values than is possible by known techniques for forming PN plug structures, as discussed in more detail below. Notably, in some embodiments the semiconductor plugs 148 may form a single plug structure, such as an isolation ring within the X-Y plane.

FIG. 1C illustrates a semiconductor device structure, shown as device structure 160 according to embodiments of the disclosure. The device structure 160 may be formed in a substrate as generally described above with respect to FIG. 1A. The device structure 160 may include, for example, the substrate base 102 and semiconductor layer 104. The device structure 160 in this embodiment is arranged having a semiconductor plug shown as the semiconductor plug 162. In this embodiment, the semiconductor plug 162 may be a variant of the semiconductor plug 106 described above, and may have similar structure as described with respect to FIG. 1A. The semiconductor plug 162 may be formed of a second dopant type where the substrate base 102 has the first dopant type and the semiconductor layer 104 is also formed having a dopant of the second dopant type. The device structure 160 may also include a surface insulator layer 146, where openings in the surface insulator layer 146 are created in order to generate features in the semiconductor layer 104. For purposes of illustration, in one example, the substrate base 102 may be P-type, having a carrier concentration of P-type active dopants of $1E19/cm^3$, while the semiconductor layer 104 is lightly doped N-type (N−) having an active dopant concentration of N-type dopants of $1E14/cm^3$. Referring again also to FIG. 1A, in the example of FIG. 1C the semiconductor plug 162 may comprise a second dopant type, in this case, an N+ region where the dopant concentration of N-type dopants of $1E19/cm^3$. The semiconductor plug 162 may accordingly be used as an electrical connector connecting different regions of the device structure 160

Figure 1D:
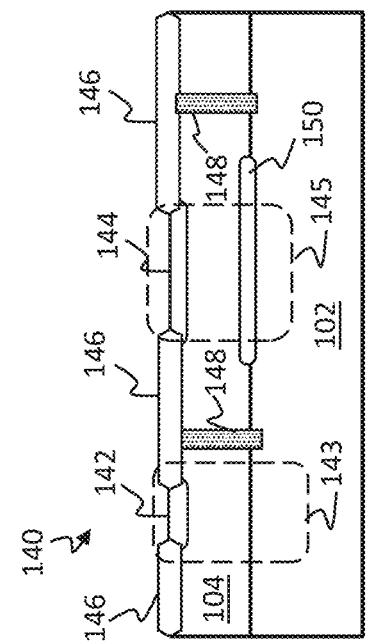
FIG. 1D illustrates a further semiconductor device structure according to embodiments of the disclosure.

FIG. 1D illustrates a semiconductor device structure, shown as device structure 180 according to embodiments of the disclosure. The device structure 180 may be formed in a substrate as generally described above with respect to FIG. 1A. The device structure 180 may include, for example, the substrate base 102 and semiconductor layer 104. The device structure 180 in this embodiment is arranged having two similar semiconductor plugs for purposes of illustration, shown as the semiconductor plugs 148. In this embodiment, the semiconductor plugs 148 may be variants of the semiconductor plug 106 described above, and may have similar structure as described with respect to FIG. 1A. The semiconductor plugs 148 may be formed of a first dopant type where the substrate base 102 also has the first dopant type and the semiconductor layer 104 is formed having a dopant of the second dopant type. The device structure 180 may also include a semiconductor plug 162 having a dopant of the second type as discussed above. In this case the device structure 180 may accordingly combine two different type of semiconductor plugs for different purposes. Each type of semiconductor plug may be formed in a similar fashion as detailed below with respect to FIGS. 2A-2F.

Figure 2A:
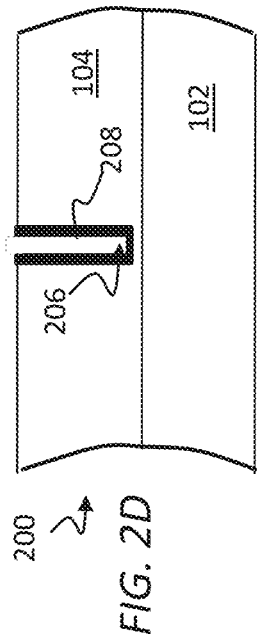
FIG. 2A to FIG. 2F depict exemplary operations for forming a semiconductor plug according to embodiments of the disclosure.

FIG. 2A to FIG. 2F depict exemplary operations for forming a semiconductor plug according to embodiments of the disclosure. In FIG. 2A, there is shown a substrate 200 including the substrate base 102 as well as the semiconductor layer 104 as previously discussed. The substrate 200 further includes a layer 202 that has an opening 203. The surface layer may be a mask material such as any conventional mask material, as known in the art. In the operation of FIG. 2A, etching species 204 are directed to the substrate 200 through the opening 203.

The etching species 204 may be composed of a known ion etching composition, such as reactive ion etchant materials. In particular, the etching species 204 may be provided as an anisotropic etching mixture, where ion species are directed along the Z-axis as shown, in a manner that generates etching generally along the Z-direction. In this manner, a cavity or trench may be generated in the substrate having dimensions similar to, or the same as the dimensions of the opening 203 within the X-Y plane. The etching of the substrate 200 may then continue until the trench reaches a target depth within the substrate. In particular, a trench is formed that extends into the semiconductor layer 104, wherein the trench has a first trench sidewall and a second trench sidewall as discussed below, where the first trench sidewall and second trench sidewall define a first interface and a second interface, respectively, with the semiconductor layer 104. As discussed further below this interface may be used to diffuse dopants into the semiconductor layer 104.

Figure 2D:
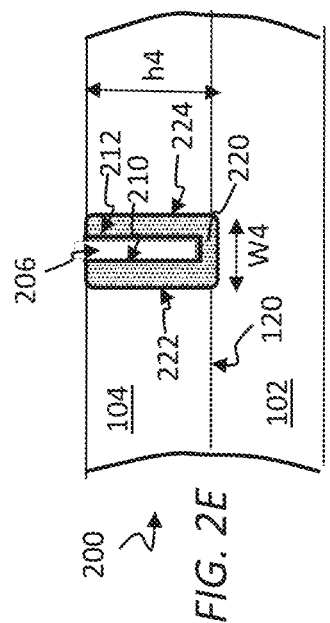
Figure 2B:
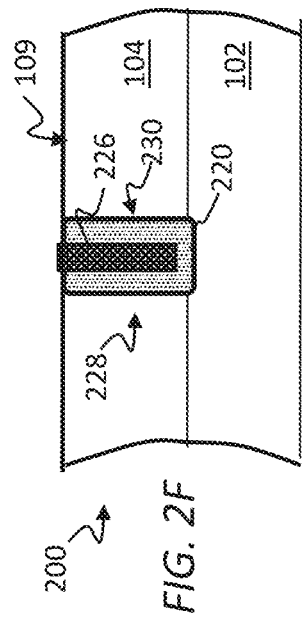

Turning now to FIG. 2B, after the operation shown in FIG. 2A, a trench 206 is formed in the semiconductor layer 104 having a depth h3 within the substrate 200. In this example, h3 may be less than the thickness h2 of the semiconductor layer 104. Notably, in other embodiments h3 may be the same as h2 or greater than h2, where the trench 206 extends into the substrate base 102. As shown in FIG. 2B, as a result of the anisotropic etch, the trench 206 may be a vertical, where the first trench sidewall 210 and second trench sidewall extend perpendicularly to the substrate base surface, as represented by interface 120, with a result where the width W2 is maintained throughout the trench 206. In other embodiments, the trench 206 need not be strictly vertical, and may have sidewalls where the sidewall angle with respect to the interface 120 is 80 degrees to 100 degrees, for example. The embodiments are not limited in this context.

Figure 2E:
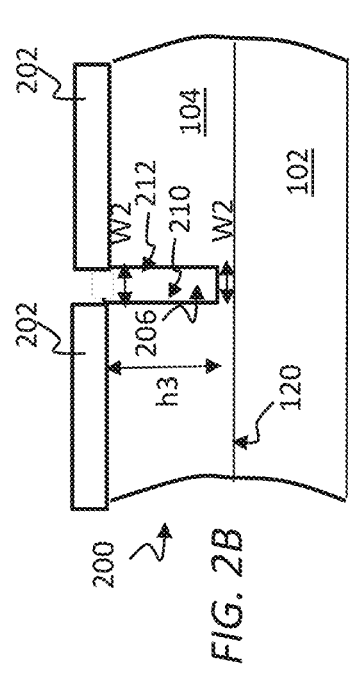
Figure 2C:
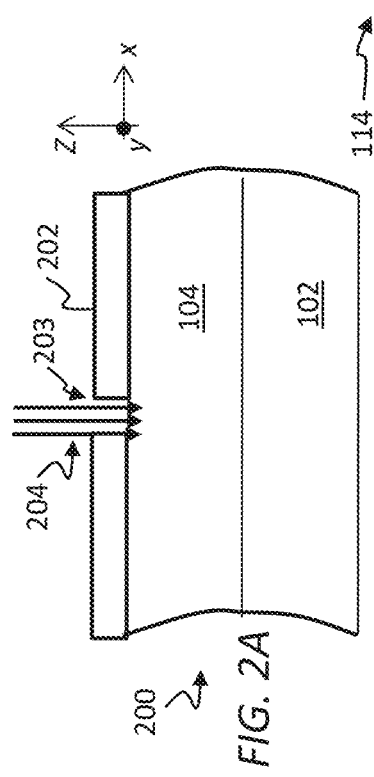

Turning now to FIG. 2C, there is shown a subsequent operation where a layer or coating, referred to herein as a dopant layer 208, is formed along the first trench sidewall 210 and second trench sidewall 212. The dopant layer 208 may also form on upper surfaces of the substrate 200 as shown. The dopant layer 208 may be formed, for example by exposing the substrate 200 to a vapor or gas including dopant species, such as boron, phosphorous, arsenic, and so forth. The dopant layer 208 may be formed using a known chemical vapor deposition process that includes species to form a condensed solid including the doping species. The dopant layer 208 may conformally coat the trench 206, where the thickness of the trench 206 is uniform within the trench 206.

Turning now to FIG. 2D, there is shown a subsequent stage where the layer 202 has been removed, which operation also removes the dopant layer 208 from top surfaces, leaving the dopant layer 208 in the trench 206. The removal of the layer 202 may be achieved by known etch processes, such as employing a selective etchant that preferably selectively etches the layer 202.

Turning now to FIG. 2E, there is shown a subsequent instance of the substrate 200 after a further operation is performed. In particular, the substrate 200 is shown after a drive in annealing of the substrate 200, wherein a diffused region 220 is formed. As shown in FIG. 2E, the diffused region 220 extends within the semiconductor layer 104 from the first trench sidewall 210 and the second trench sidewall 212. The diffused region 220 represents a portion of the semiconductor layer 104 where dopant atoms from the dopant layer 208 have diffused into the semiconductor layer. The dopant atoms in the diffused region may also be electrically active, meaning that the dopant atoms reside on dopant sites in the semiconductor layer 104, creating electronic donors or acceptors. The diffused region 220 may be characterized by a first boundary 222 and a second boundary 224, where the first boundary 222 and the second boundary 224 extend perpendicularly to the substrate base surface, as represented by interface 120. Advantageously, in accordance with the present embodiments, the annealing to form the diffused region 220 may be performed at a lower thermal budget as compared to known processes used to form semiconductor plugs. In some embodiments, the annealing temperature for creating the diffused region 220 may range from (1000° C.) to (1200° C.), while the annealing duration may range from (30 min) to (120 min), where the diffused region 220 may be a P-type region formed using boron or may be an N-type region formed using phosphorous, for example. Further advantageously, because the trench 206 extends vertically into the semiconductor layer 104, and because the dopant layer 208 may initially extend all along the first trench sidewall 210 and second trench sidewall 212, the diffused region 220 may accordingly be formed to extend to any desired depth into the substrate 200. This desired depth is accomplished by first etching the trench 206 to a target depth before depositing the dopant layer 208. Additionally, because diffusion from the dopant layer 208 may be assumed to take place uniformly across the first trench sidewall 210 and second trench sidewall 212 parallel to the X-axis, the first boundary 222 and second boundary 224 of the diffused region 220 may be accordingly form in a vertical fashion as shown. Thus, a width W4 of the diffused region may be maintained at a constant value independent of the value of h3. Notably, because diffusion of dopant species from dopant layer 208 may also take place from the lower surface of trench 206, the height h4 of the diffused region 220 may exceed the height h3. In this example, the diffused region 220 may extend below the substrate base surface, as represented by interface 120.

Figure 2F:
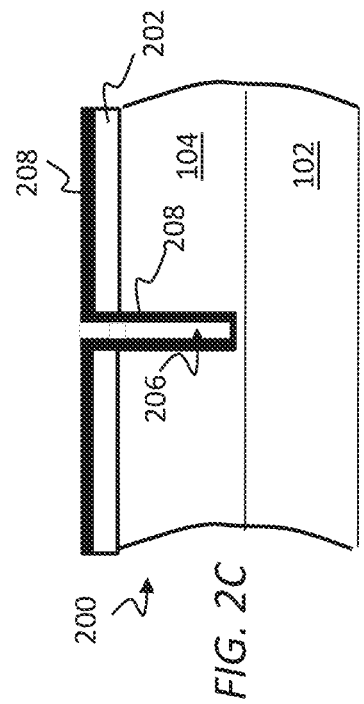

Turning now to FIG. 2F there is shown a subsequent stage after deposition of a fill material 226 in the trench 206. In various embodiments, the fill material 226 may be a polysilicon material deposited by chemical vapor deposition of other technique. Notably, after the fill material 226 has been deposited in the trench 206, a planarization step may be performed to remove any fill material from unwanted surfaces, such as the upper surface 109.

FIGS. 3A-3C provide simulations of formation of semiconductor plug structures, illustrating advantages of the present embodiments. In FIG. 3A, there is shown a substrate base 302, where the substrate base may be P-type silicon. A 5.5 µm thick semiconductor layer 310, composed of N-type silicon is disposed on the substrate base 302. An oxide layer 304 is provided on an upper surface of the semiconductor layer 310, including an opening in the oxide layer 304. The scenario of FIG. 3A illustrates an instance after implantation of a doped region 308, where the doped region 308 may be made of boron. Turning now to FIG. 3B, there is shown a scenario after a known annealing process is performed to diffuse dopants from the doped region 308 in order to drive the dopants to a sufficient depth to contact the P-type region, meaning the substrate base 302. The annealing time is 60 minutes and the annealing temperature is 1150° C. In this manner, a P-type region 314 is formed, including a semiconductor plug region 312 formed from diffusion of dopant from the doped region 308, and the substrate base 302. The horizontal surface 316 of the P-type region 314 may lie above the substrate base surface 318 due to diffusion of p-type dopants from the substrate base 302 during the annealing. This may be especially pronounced when using a thermal budget according to known techniques. In this case the horizontal surface 316 has shifted 1.5 µm from the substrate base surface 318. Moreover, the width W5 of the semiconductor plug region 312 is approximately 12 µm.

Turning now to FIG. 3C there is shown the structure of a semiconductor plug after formation according to techniques of the present embodiments. Notably the horizontal length scale (along the X-axis) in FIG. 3C differs from that of FIG. 3B. In this example, a semiconductor plug 330 has been formed in accordance with the techniques disclosed above with respect to FIGS. 2A-2F. The semiconductor plug 330 includes a fill region 322 and diffused region 336, where vertical boundary 332 and vertical boundary 334 are formed. The fill region 322 may be formed from a trench that was previously formed by etching to a point below the interface 328 between the substrate base 302 and semiconductor layer 320. Subsequent annealing results in the formation of the vertical boundary 332 and vertical boundary 334. This approach allows a narrower semiconductor plug to be formed even if the thickness of the semiconductor layer 320 and semiconductor layer 310 are the same. In this example, the width W6 is approximately 4.5 µm. In various embodiments of the disclosure, a semiconductor plug may have a plug width between a first boundary and second boundary of between 4 µm to 10 µm, and in particular embodiments a plug width of between 3 µm to 6 µm. The embodiments are not limited in this context. Accordingly, a semiconductor plug functioning as a PN junction isolation structure may be formed having a much narrower width than achieved by conventional approaches.

Figure 4:
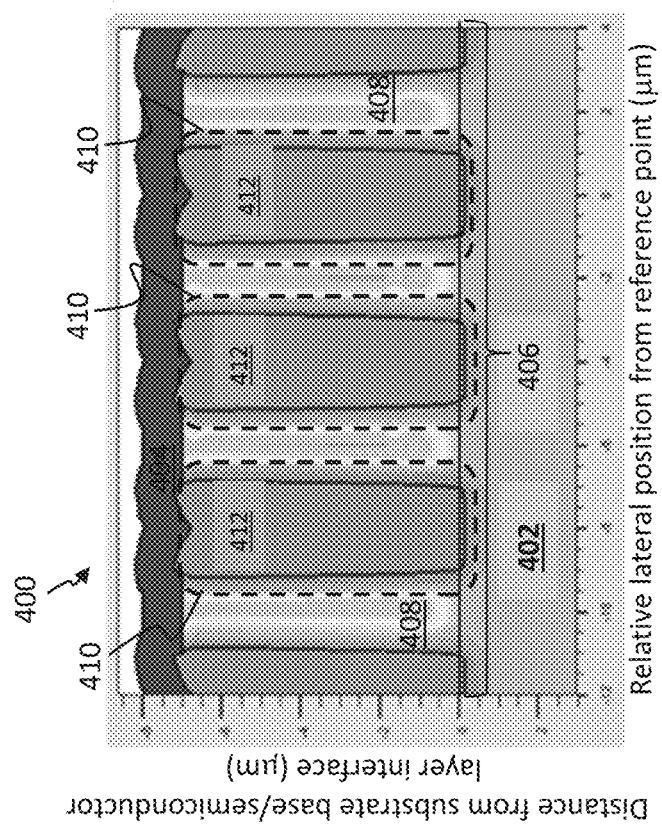
FIG. 4 illustrates a simulation of dopant profiles for a semiconductor plug assembly according to various embodiments of the disclosure.

FIG. 4 illustrates a simulation of dopant profiles for a semiconductor plug assembly according to various embodiments of the disclosure. A substrate 400 is shown having a substrate base 402 and semiconductor layer 408 formed on the substrate base 402. In the example shown, a semiconductor plug assembly 406 is formed in the semiconductor layer 408. The semiconductor plug assembly 406 may include one or more semiconductor plugs 410. In the simulation shown, the semiconductor plug assembly 406 includes at least five of the semiconductor plugs 410, where the semiconductor plugs 410 extend from an oxide layer 404, formed on the upper surface of substrate 400, into the substrate base 402. According to embodiments of the disclosure, a semiconductor plug 410 may be used as an electrical connector, providing a low resistance path. As illustrate in FIG. 4, a given semiconductor plug may provide uniform doping in the semiconductor layer 408, by virtue of the diffusion of dopant from a trench 412. In embodiments where a semiconductor plug assembly 406 includes a plurality of semiconductor plugs, as shown in FIG. 4, a uniformly doped region is formed, providing lower series resistance.

Figure 5:
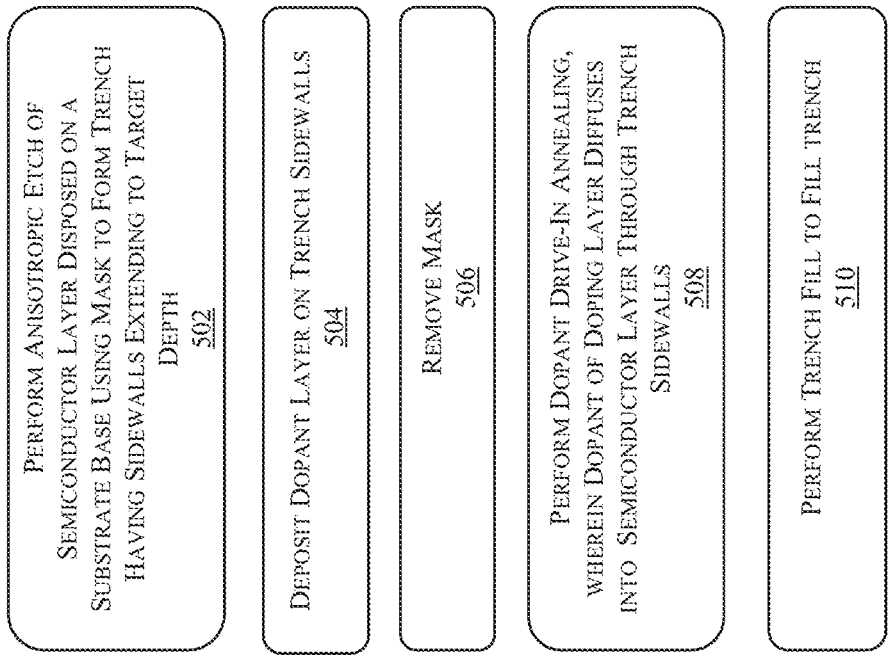
FIG. 5 depicts an exemplary process flow.

FIG. 5 depicts an exemplary process flow 500 according to embodiments of the disclosure. At block 502 an anisotropic etch is performed in a semiconductor layer. The substrate layer may be disposed on a substrate base of a substrate. The anisotropic etch may be performed using a mask formed on an upper surface of the semiconductor layer, where the mask includes openings exposing the semiconductor layer. Accordingly, the anisotropic etch may form a trench having sidewalls extending to a target depth within the substrate. In some embodiments, the trench sidewalls may include a first trench sidewall and a second trench sidewall opposite the first trench sidewall, where the first trench sidewall and second trench sidewall extend perpendicularly to a substrate base surface of the substrate base.

At block 504, a dopant layer is deposited on the trench sidewalls. In various embodiments, the dopant layer may be deposited by chemical vapor deposition or other technique. The dopant layer may include a P-type dopant or an N-type dopant in different embodiments. At block 506 the mask material is removed from the substrate. The removal of the mask may also remove any portions of the dopant layer disposed on the mask.

At block 508, a dopant drive-in annealing operation is performed, where the dopant of the dopant layer diffuses into the semiconductor layer through the trench sidewalls. At block 510, a trench fill operation is performed to fill the trench, for example with polysilicon or doped polysilicon. For example, for a dopant drive in to form a P-type dopant layer, after the dopant drive-in annealing is performed a boron-doped polysilicon may be deposited, while for a dopant drive in to form a N-type dopant layer, after the dopant drive-in annealing is performed a phosphorous-doped polysilicon may be deposited. The embodiments are not limited in this context. While undoped polysilicon may be used, the use of a doped polysilicon helps to keep device resistance lower in resulting devices.

While the present embodiments have been disclosed with reference to certain embodiments, numerous modifications, alterations and changes to the described embodiments are possible without departing from the sphere and scope of the present disclosure, as defined in the appended claims. Accordingly, it is intended that the present embodiments not be limited to the described embodiments, and that it has the full scope defined by the language of the following claims, and equivalents thereof.

What is claimed is:

1. A method of forming a semiconductor plug in a substrate, comprising:
    providing a semiconductor layer on a substrate base surface of a substrate base, the substrate base comprising a first dopant type, and the semiconductor layer comprising a second dopant type;
    etching a trench into the semiconductor layer, wherein the trench has a trench depth less than a thickness of the semiconductor layer and has a first trench sidewall and a second trench sidewall, wherein the first trench sidewall and the second trench sidewall extend perpendicularly to the substrate base surface;
    forming a conformal dopant layer along an inside surface of the trench; and
    annealing the substrate to cause the conformal dopant layer to diffuse into the semiconductor layer to form a diffused region having a first boundary and a second boundary, the first boundary and the second boundary extending within the semiconductor layer from the first trench sidewall and the second trench sidewall, wherein the first boundary and the second boundary define a boundary between the semiconductor plug and the semiconductor layer,
    wherein the diffused region extends from a bottom of the trench lying within the semiconductor layer to a depth below the semiconductor layer into the substrate base.

2. The method of claim 1, wherein the semiconductor plug comprises the first dopant type, the method further comprising:
    providing a first device in a first region of the substrate, the first device being at least partially disposed within the semiconductor layer; and
    providing a second device in a second region of the substrate, the second device being at least partially disposed within the semiconductor layer, the first region being laterally displaced from the second region, wherein the semiconductor plug is disposed between the first device and second device and electrically isolates the first device from the second device.

3. The method of claim 1, wherein the semiconductor plug comprises the second dopant type, wherein the semiconductor layer has a first concentration of the second dopant type, wherein the semiconductor plug has a second concentration of the second dopant type, and wherein the second concentration is greater than the first concentration.

4. The method of claim 1, further comprising, after forming the diffused region, filling the trench with a fill material.

5. The method of claim 4, wherein the fill material is polysilicon or doped silicon.

6. The method of claim 1, wherein the semiconductor plug has a plug width between the first boundary and second boundary of 3 µm to 6 µm.

7. The method of claim 1, wherein the semiconductor plug comprises a first semiconductor plug, the method further comprising:
    forming at least one additional semiconductor plug adjacent the first semiconductor plug so as to form a semiconductor plug assembly, and wherein the semiconductor plug assembly comprises the second dopant type.

8. The method of claim 2, wherein the semiconductor plug comprises a first semiconductor plug comprising the first dopant type and being formed within a first region, the method further comprising:
    forming a second semiconductor plug comprising the second dopant type, wherein the semiconductor layer has a first concentration of the second dopant type, wherein the second semiconductor plug has a second concentration of the second dopant type, wherein the second concentration is greater than the first concentration, and wherein the second semiconductor plug is formed within a second region, the second region being laterally displaced from the first region.

9. The method of claim 8, wherein the first semiconductor plug and the second semiconductor plug each comprise a plug width of 3 µm to 6 µm.

10. A method of forming a semiconductor plug in a substrate, comprising:
    providing a semiconductor layer on a surface of a substrate base;
    etching a trench into the semiconductor layer, wherein the trench has a trench depth less than a thickness of the semiconductor layer;
    forming a conformal dopant layer along an inside surface of the trench; and
    annealing the substrate to cause the conformal dopant layer to diffuse into the semiconductor layer to form a diffused region;
    wherein the diffused region extends from a bottom of the trench lying within the semiconductor layer to a depth below the semiconductor layer into the substrate base.

11. The method of claim 10:
    wherein the substrate base comprises a first dopant type and the semiconductor layer comprises a second dopant type; and
    wherein the semiconductor plug comprises the first dopant type, the method further comprising:
        providing a first device in a first region of the substrate, the first device being at least partially disposed within the semiconductor layer; and providing a second device in a second region of the substrate, the second device being at least partially disposed within the semiconductor layer, the first region being laterally displaced from the second region, wherein the semiconductor plug is disposed between the first device and second device and electrically isolates the first device from the second device.

12. The method of claim 10:
wherein the substrate base comprises a first dopant type and the semiconductor layer comprises a second dopant type;
wherein the semiconductor plug comprises the second dopant type;
wherein the semiconductor layer has a first concentration of the second dopant type;
wherein the semiconductor plug has a second concentration of the second dopant type; and
wherein the second concentration is greater than the first concentration.

13. The method of claim 10, further comprising, after forming the diffused region, filling the trench with a fill material.

14. The method of claim 13, wherein the fill material is polysilicon or doped silicon.

15. The method of claim 10, wherein the semiconductor plug has a plug width of 3 µm to 6 µm.

16. The method of claim 10, wherein the semiconductor plug comprises a first semiconductor plug, the method further comprising:
forming at least one additional semiconductor plug adjacent the first semiconductor plug so as to form a semiconductor plug assembly comprising the second dopant type.

17. The method of claim 11, wherein the semiconductor plug comprises a first semiconductor plug comprising the first dopant type and being formed within a first region, the method further comprising:
forming a second semiconductor plug comprising the second dopant type;
wherein the semiconductor layer has a first concentration of the second dopant type;
wherein the second semiconductor plug has a second concentration of the second dopant type;
wherein the second concentration is greater than the first concentration; and
wherein the second semiconductor plug is formed within a second region.

* * * * *